(12) United States Patent
Lee et al.

(10) Patent No.: US 10,410,758 B2
(45) Date of Patent: Sep. 10, 2019

(54) METHOD FOR PATTERNING METAL NANOWIRE-BASED TRANSPARENT CONDUCTIVE FILM THROUGH SURFACE TREATMENT

(71) Applicant: DONGJIN SEMICHEM Co., Ltd., Incheon (KR)

(72) Inventors: Byong Wook Lee, Hwaseong (KR); Sung Hyun Lee, Hwaseong (KR); Kyung Eun Kim, Hwaseong (KR); Myeong Jin Kim, Hwaseong (KR); Dong Min Seo, Hwaseong (KR); Seong Bae Kim, Hwaseong (KR)

(73) Assignee: DONGJIN SEMICHEM CO., LTD., Incheon (KR)

(*) Notice: Subject to any disclaimer, the term of this patent is extended or adjusted under 35 U.S.C. 154(b) by 383 days.

(21) Appl. No.: 15/101,488

(22) PCT Filed: Dec. 29, 2014

(86) PCT No.: PCT/KR2014/012964
§ 371 (c)(1),
(2) Date: Jun. 3, 2016

(87) PCT Pub. No.: WO2015/102335
PCT Pub. Date: Jul. 9, 2015

(65) Prior Publication Data
US 2018/0174703 A1    Jun. 21, 2018

(30) Foreign Application Priority Data
Dec. 30, 2013 (KR) .................. 10-2013-0166586

(51) Int. Cl.
*H01L 21/00* (2006.01)
*H01B 5/14* (2006.01)
(Continued)

(52) U.S. Cl.
CPC .............. *H01B 5/14* (2013.01); *B82Y 10/00* (2013.01); *B82Y 30/00* (2013.01); *G02B 1/10* (2013.01); *H01L 29/413* (2013.01)

(58) Field of Classification Search
CPC ....... H01L 29/413; B82Y 10/00; B82Y 30/00; G02B 1/10; H01B 5/14
See application file for complete search history.

(56) References Cited

U.S. PATENT DOCUMENTS

2012/0180852 A1* 7/2012 Cheng ............... C09K 13/08
136/252

FOREIGN PATENT DOCUMENTS

| CN | 102250506 | 11/2011 |
| CN | 102324462 | 1/2012 |
| (Continued) | | |

OTHER PUBLICATIONS

Machine translation of JP 2013-198990, Jul. 2018.*

*Primary Examiner* — Richard A Booth
(74) *Attorney, Agent, or Firm* — Lex IP Meister, PLLC

(57) ABSTRACT

The present invention relates to a method for patterning a metal nanowire-based transparent conductive film through surface treatment and, more particularly, to a method wherein the refractive index is adjusted by adding an optical functional layer prior to a patterning process, the surface of a metal nanowire transparent conductive film is oxidized using a surface treatment agent composition or a salt compound is generated, thereby changing the color and insulating the surface, and a film having excellent visibility is patterned.

15 Claims, 3 Drawing Sheets

(51) Int. Cl.
    *G02B 1/10*      (2015.01)
    *B82Y 10/00*     (2011.01)
    *B82Y 30/00*     (2011.01)
    *H01L 29/41*     (2006.01)

(56) References Cited

FOREIGN PATENT DOCUMENTS

| | | |
|---|---|---|
| CN | 102543303 | 7/2012 |
| JP | 2013-198990 | 10/2013 |
| JP | 2013-225489 | 10/2013 |
| KR | 10-2009-0112626 | 10/2009 |
| KR | 10-2012-0134955 | 12/2012 |
| KR | 10-2013-0063891 | 6/2013 |
| KR | 10-1359913 | 2/2014 |

\* cited by examiner

(12)  US 10,410,758 B2

METHOD FOR PATTERNING METAL NANOWIRE-BASED TRANSPARENT CONDUCTIVE FILM THROUGH SURFACE TREATMENT

FIELD OF THE INVENTION

The present invention relates to a method for patterning a metal nanowire-based transparent conductive film through surface treatment and, more particularly, to a method wherein the refractive index is adjusted by adding a performance reinforcement layer prior to a patterning process, the surface of a metal nanowire transparent conductive film is oxidized using a surface treatment agent composition or a salt compound is generated, thereby changing the color and insulating the surface, and a film having excellent visibility is patterned.

BACKGROUND OF THE INVENTION

ITO, a typical transparent conductive film, is actively applied to a touch screen panel, OLED device, flexible device, etc., but it has a limit as a metal oxide to satisfy low sheet resistance and high flexibility which are required as substrates become enlarged, so an alternative material is urgently in need.

As an alternative material for solving the problem, a metal nanowire-based transparent conductive film is applied, and it has been used in various fields because it can achieve a low sheet resistance and have an excellent flexibility while maintaining high optical properties in films which are not achieved with ITO.

Unlike ITO, however, the metal nanowire-based-transparent conductive films have the disadvantage of a poor visibility when their patterning was conducted through an etching process. In the conventional ITO films, there were numerous efforts for adjusting high refractive index of ITO itself, but in the case of the metal nanowires, a haze by the light scattering reflected from the metal has been known as a factor which heavily affects the visibility, rather than the refractive index, and in fact, in the case of a silver nanowire, as the haze is distinguished from an etched portion and a non-etched portion, there is a problem that patterns are easily recognized to naked human eyes.

In the conventional transparent conductive films consisting of metal nanowires, patterns are formed through an etching process without any consideration of the visibility and there have been attempts to adjust the refractive index or haze properties of the etched surface and non-etched surface by forming an additional anti-reflection film on the etched surface or the rear surface of the etched surface, but in case that the anti-reflection film is formed with no distinction between the etched surface and the non-etched surface, it does not have a great effect on the visibility because the same anti-reflection effect is given to the non-etched surface as well.

SUMMARY OF THE INVENTION

In order to ensure visibility with no additional configuration of an optical functional layer after the patterning process of the metal nanowire-based transparent conductive films, an optical characteristics difference between a patterned portion and a non-patterned portion should be minimized. In particular, as the haze characteristics is the factor that most affects the visibility properties of the metal nanowire-based films, a haze difference between the patterned portion and the non-patterned portion should be reduced.

To solve the above problems, it is an object of the invention to provide a method wherein the refractive index is adjusted by adding an optical functional layer prior to a patterning process, the surface of a metal nanowire transparent conductive film is oxidized using a surface treatment agent composition or a salt compound is generated, thereby changing the color and insulating the surface, and a film having excellent visibility is patterned.

Also, it is an object of the invention to provide a metal nanowire-based transparent conductive film having an excellent visibility prepared by the above method, and an electronic device comprising the film.

In order to achieve the objects, the present invention provides a method for patterning a metal nanowire-based transparent conductive film through surface treatment wherein the patterning process of the metal nanowire-based transparent conductive film comprises 1) adding a performance reinforcement layer on the conductive layer; and 2) treating the surface of the metal nanowire transparent conductive film with a surface treatment composition comprising a) a peroxide and b) an organic acid or an inorganic acid.

Further, the invention provides a metal nanowire-based transparent conductive film patterned by the above surface treatment method.

Still further, the invention provides an electronic device comprising the above transparent conductive film.

The patterning method through the surface treatment of metal nanowires in accordance with the present invention is advantageous in pattern visibility in comparison with the conventional etching process where insulation properties are given by disassembling or separating the metal nanowires, and furthermore it can secure excellent durability and environment resistance properties capable of protecting the conductive layer from the outside moisture and temperature changes as well as high visibility by introducing a metal oxide sol into an optical functional layer.

The method for patterning a metal nanowire-based transparent conductive film through surface treatment in accordance with the present invention is characterized in that the patterning process of the metal nanowire-based transparent conductive film comprises 1) adding a performance reinforcement layer on the conductive layer; and 2) treating the surface of the metal nanowire transparent conductive film using a surface treatment composition comprising a) a peroxide and b) an organic acid or an inorganic acid.

DETAILED DESCRIPTION OF THE INVENTION

Hereinafter, the invention will be described in detail.

1) Performance Reinforcement Layer

The transparent conductive film of the present invention may place an over-coating material for performance reinforcement up on the conductive layer comprising metal nanowires, thereby enhancing its function, and the composition for forming performance reinforcement layer may comprise a metal oxide sol for obtaining excellent durability and environment resistance properties capable of protecting the conductive layer from the outside moisture and temperature changes as well as having anti-reflection properties.

Figure 1:
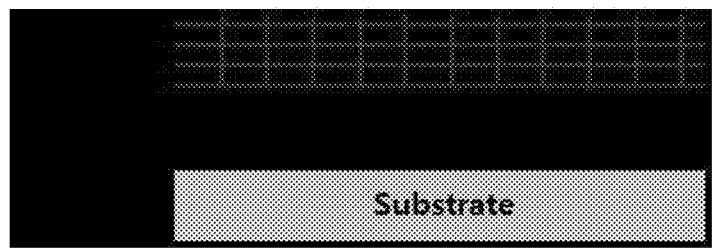
FIG. 1 to FIG. 4 show the structure of a transparent conductive film comprising a conductive layer (11), a performance reinforcement layer (12), and an anti-reflection film (21) according to the present invention.

As an embodiment of the present invention, FIG. 1 shows a multi-layer transparent conductive film comprising a substrate, a conductive layer (11) formed on the substrate wherein metal nanowires are evenly applied to exhibit a high electrical conductivity, and a performance reinforcement layer (12) thereon of which the protective layer and the hard coating roles are highlighted.

The metal oxide sol to be used in the present invention may include one or more metal oxide sols selected from the group consisting of magnesium fluoride sol, calcium fluoride sol, ZTO (Zinc-Tin oxide) sol, ZnO (Zinc Oxide) sol, silicon oxide sol, tin oxide sol (Tin oxide), manganese oxide sol and magnesium oxide sol, and the composition may comprise the metal oxide preferably in an amount of 0.5 to 5% by weight.

Furthermore, the metal oxide sol may further comprise a binder to adjust the resistance properties, hard coating properties, etc. of the performance reinforcement layer and the conductive layer, and in particular, the binder resin may prevent transparent conductive films from being broken when they are bent by providing excellent coating properties and flexibility to the films when mixed with the metal oxide sol.

The binder to be combined with the metal oxide sol may include a cellulose resin, polyvinyl alcohol resin, polyvinyl butyral resin, polyurethane acrylate resin, a cellulose ether resin, cellulose acetate resin and the like, and the binder may prevent the transparent conductive films from being broken when they are bent by providing excellent coating properties and flexibility to the films when mixed with the metal oxide sol.

More particularly, the binder may include hydroxypropyl cellulose, hydroxyethyl cellulose, hydroxypropyl cellulose, methyl cellulose, ethyl cellulose, carboxymethyl cellulose, triacetyl cellulose, diacetyl cellulose, cellulose acetate butyrate, cellulose acetate propionate, polyvinyl alcohol, polyvinyl butyral, polyvinyl pyrrolidone, polyvinyl butyral vinyl alcohol copolymer, polyvinyl ester maleic copolymer and the like.

The binder resin may be preferably used in an amount of 0.05 to 10% by weight in the composition for forming the performance reinforcement layer of the invention. If the content is less than 0.05% by weight, its original purpose for adjusting viscosity, improving coating properties, increasing adhesive to the substrate, and providing flexibility via the organic binder resin cannot be achieved so that metal nanowires may be separated from the substrate when the film formed thereby is bent over a certain degree, or it may be difficult to form a film with excellent electrical conductivity because the conductive coating composition is not evenly coated over the entire surface of the substrate. If the content exceeds 10% by weight, the binder resin may serve an insulator of rapidly increasing the contact resistance of the transparent conductive film by inhibiting contact with the metal nanowires, and its viscosity may be drastically increased so that the film may be formed thick, causing a problem of deteriorating the optical properties. If the film thickness is too thick, the entire film is tinged with yellow, causing an adverse effect on visibility.

The combination between the metal oxides or the combination of the metal oxides and the binder may exhibit resistance reinforcing effects capable of achieving lower resistance than when only conventional conductive layer is present, by increasing the adhesion between the metal nanowires included in the conductive layer thereunder when they are being dried, thereby to lower the contact resistance of the metal nanowires, and in addition, it may exhibit resistance uniformity improvement over a wide area.

Furthermore, the properties of the metal oxide can show a high reliability in durability and environmental resistance. That is, it can increase hardness reinforcement, wear resistance, and environment resistance by serving as a hard coating capable of raising the physical properties of the transparent conductive film, and can protect the metal nanowires in a chemical treatment process for surface treatment. These properties are because the metal oxide itself serves to suppress the permeation of gases or fluids.

In addition, the transparent conductive film of the present invention may further comprise an anti-reflection film. The anti-reflection film, which is a layer capable of reducing reflection loss at a reflective surface of a transparent conductor, functions to minimize differences of surface optical characteristics which change after surface treatment. For the anti-reflection film, any known compositions for forming anti-reflection films may be used, and for example, $MgF_2$ may be used. The anti-reflection film may be formed on the top of the performance reinforcement layer as a protective layer, on the bottom of the conductive layer, or on the rear surface of the substrate, and in case that it is formed on the top of the protective layer, it can obtain a superior visibility correction effect.

The anti-reflection film may be formed in a coating manner between the conductive layer and the substrate, or on the rear surface of the conductive layer or on the top of the conductive layer according to its need as a multi-functional layer capable of performing an anti-reflection effect, resistance reinforcing effect, hard coating effect at the same time.

Figure 2:
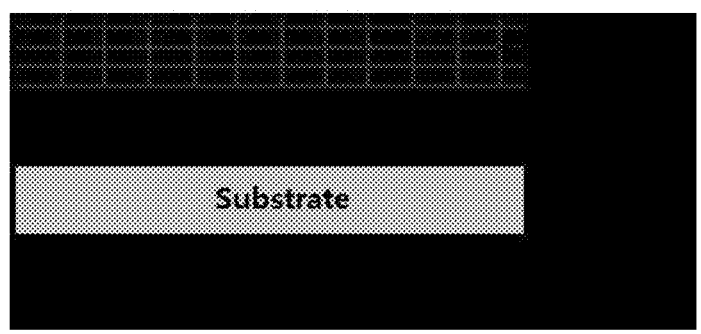
Figure 3:
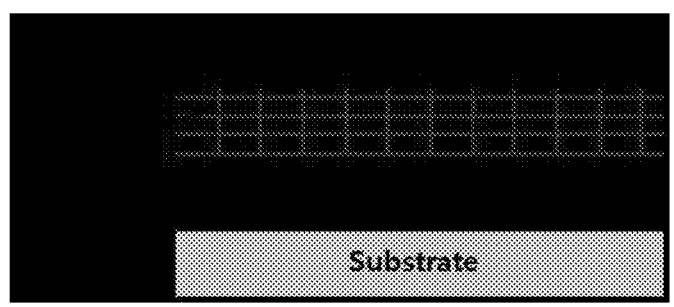
Figure 4:
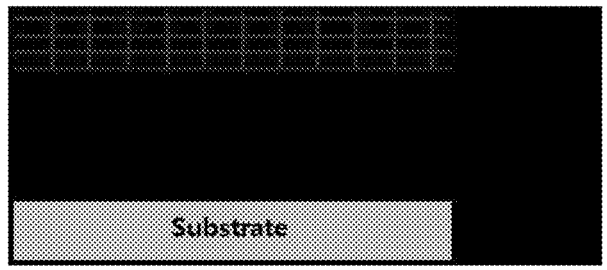

The transparent conductive film of the present invention may have structures illustrated in FIG. 2 to FIG. 4.

FIG. 2 shows a structure further comprising an anti-reflection film (21) of which the anti-reflection function is highlighted on the rear surface of the substrate, and the anti-reflection film (21) is a layer which is not damaged by a surface treatment agent during surface treatment and shows film quality with excellent chemistry resistance.

FIG. 3 shows a structure further comprising an anti-reflection film (21) on the performance reinforcement layer (12) which functions as a protective layer and hard coating, thus showing anti-reflection effects, whereby it can correct visibility by color difference after surface treatment.

FIG. 4 shows a structure comprising a conductive layer (11) formed on an anti-reflection film (21), and a performance reinforcement layer (12) thereon, of which the protective layer and the hard coating roles are highlighted.

The performance reinforcement layer (12) and the anti-reflection film (21) may be formed in a usual manner, and for example, they may be each formed in a thickness of 10 to 500 nm using slit coating, bar coating, spin coating, etc. If the thickness of the above layer exceeds 500 nm, it may lose resistance reinforcement effects and inhibit sheet resistance properties of the metal nanowires themselves. If the thickness is less than 10 nm, it may not serve as a performance reinforcement layer.

2) Surface Treatment Composition

In the present invention, DFR (dry film resist) is placed on the transparent conductive layer prepared as described in the above, DFR is patterned by a photo patterning method, followed by insulation by contacting a selected region with a surface treatment agent, and DFR is removed so that an insulated region and a conductive region can be separated. The method of contacting the selected region with the surface treatment agent in the above may be a known method such as spray coating or dipping.

The surface treatment may be defined as a process of changing the surface state of the metal nanowires embedded in the conductive layer into a metal salt compound or metal oxide form, and the metal nanowires may be cut off into smaller units in the process of changing into some metal salt compounds.

For the surface treatment, a surface treatment composition comprising a) a peroxide, and b) an organic acid or an inorganic acid, preferably a) perchlorate or a salt thereof, or a persulfate, and b) an organic acid. This perchlorate-based compound is a hypochlorite, chlorite, chlorate, perchlorate and the like, and more specifically, the peroxide may include sodium peroxide, carbamide peroxide, $NaOCl$, $NaClO_4$, $NaClO_2$, $NaClO_3$, $NH_4ClO$, $NH_4ClO_2$, $NH_4ClO_3$, $NH_4ClO_4$, $KClO_3$, $KClO$, $KClO_4$, $KClO_2$ and $POCl_3$ (phosphorus oxychloride). The compound can be mixed in the distilled water in the amount of about 0.1 to 10% by weight.

In addition, the peroxide surface treatment agent may be further mixed with an inorganic compound.

The organic acid, inorganic acid or inorganic compound may be helpful to the peroxide so that it can stay in a more stable way in the surface treatment agent because the peroxide is continuously consumed through the reaction with water. The organic acid may be acetic acid, lactic acid, maleic acid, succinic acid, oxalic acid, malonic acid and the like, the inorganic acid may be phosphoric acid, hydrochloric acid, nitric acid and the inorganic compound may be chlorides, nitrides, acetates, sulfides, etc. of copper, iron, zinc, tin, and nickel, and they can be used in conjunction with peroxide in an amount of about 0.1 to 10% by weight. Preferably, the organic acid is recommended.

If the content of the peroxide is more than 10% by weight, it may damage a functional layer and interfere with the role of the functional layer, and if it is less than 0.1% by weight, it may not produce an insulated region by failing to oxidize the metal nanowires. Furthermore, if the organic acid, inorganic acid or inorganic compound which can be applied together with the peroxide exceeds 10% by weight, it may interfere with the role as a functional layer because it has negative effects on the visibility by breaking nanowires, and if it is less than 0.1% by weight, it seems difficult to increase surface treatment effects or to have time shortening effects. In other words, it cannot stabilize the peroxide.

Figure 5:
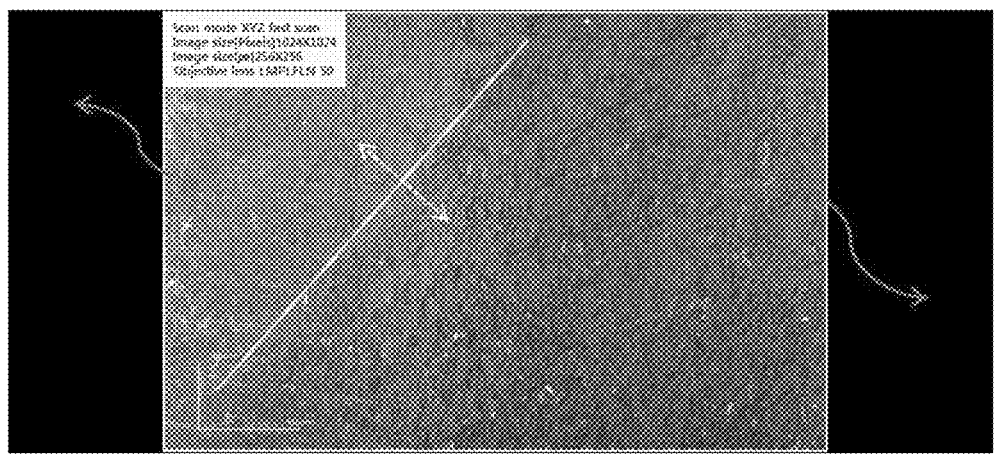
FIG. 5 is a photograph showing an insulation region (51) and a conductive region (52) of the film after its surface treatment.

FIG. 5 shows an insulated region (51) and a conductive region (52) in case that surface treatment is performed using the surface treatment composition in accordance with the present invention. A metal nanowire structure appears intact in both the insulated region and the conductive region, and the surface of the insulated region rather than the surface of the conductive region appears as a darker region than its original brightness. That is, in the insulated region, only surface state of the metal nanowires has been changed while the metal nanowire structure is not being changed by cutoff or elimination, and insulating effects can be obtained by change of the surface state of the metal nanowires.

More specifically, silver was applied as the metal nanowire of FIG. 5, and this case can show a more excellent visibility than the conventional method where an insulation state is obtained by eliminating or cutting silver nanowires shortly.

Accordingly, the patterning method in accordance with the present invention is characterized in that insulation can be achieved without damaging the metal nanowires of a non-patterned portion. As metal nanowires provided with insulation properties show some color change or coloration, they can have difference in visibility from normal metal nanowires. However, in the present invention, visibility due to the color difference can be overcome by the performance reinforcement layer of which the refractive index is adjusted on the surface-treated metal nanowire layer. That is, it is characterized by minimizing a haze difference between the patterned portion and non-patterned portion by introducing a process that can secure the insulating properties without an etching process that eliminates the metal nanowires.

The surface resistance of the surface-treated region as described above should secure the insulating properties more than several MΩ, and variation in optical properties between the surface-treated region and the other region is to be minimized.

3) Metal Nanowires

The conductive coating composition of the present invention uses a metal nanowire as a conductive material. The metal nanowire to be used in the invention may be an ordinary metal nanowire used for forming conductive films, and more specifically, the metal to be used is not particularly limited, preferably it may be one or more metals selected from the group consisting of group I, group IIA, group IIIA, group IVA, and group VIII B metals such as gold, silver, copper, aluminum, nickel, tin, palladium, platinum, zinc, iron, indium, magnesium, etc., and more preferably, it may be one or more metals selected from the group consisting of zinc, aluminum, tin, copper, silver and gold.

The metal nanowire may have preferably a diameter of 15 nm to 120 nm and a length of 5 μm to 60 μm.

The substrate used in the present invention may be a commonly used transparent substrate, and for example, it may use a polyimide (PI) substrate, a polyethylene terephthalate (PET) substrate, a polycarbonate (PC) substrate, a cyclo olefin polymer (COP) substrate, a polyethylene naphthalate (PEN) substrate, etc.

Also, the present invention provides a transparent conductive film formed according to the above method. Since the transparent conductive film prepared using the inventive composition and method has a light transmittance of 80% or more and a sheet resistance of 300Ω/□ or less, and not only has excellent sheet resistance, environment resistance, full permeability and haze properties but also can undergo surface treatment easily without an etching process, it can be usefully applied to an electrode of a liquid crystal display device, a plasma display device, a touch panel, a light emitting device, a thin film solar cell, a dye-sensitized solar cell, and an inorganic material crystalline solar cell, etc.

For a better understanding of the present invention, preferred examples follow. The following examples are intended to merely illustrate the invention without limiting the scope of the invention.

EXAMPLES

Preparation 1: Preparation of Transparent Conductive Film Comprising Silver Nanowires A polyethylene terephthalate (PET) film, which is an optically transparent insulator was used in the thickness of 50 to 188 μm as a substrate. A silver nanowire (AgNW) in the width of about 20 nm to 70 nm and the length of about 10 to 30 μm was used, being dispersed in ethanol at a concentration of about 0.1% w/v. Hydroxypropyl cellulose (HPC) was used as a thickening agent for adjusting viscosity. The silver nanowire dispersion solution was coated on to the PET substrate using a bar coater after forming a sediment on the substrate, and then evaporated and dried to prepare a transparent conductive film comprising a substrate and a conductive layer.

Preparation 2: Formation of Performance Reinforcement Layer

A silicon oxide-based compound was dispersed as a metal oxide sol in ethanol at a concentration of 12.5% w/v, mixed with hydroxypropyl cellulose dissolved in ethanol at a concentration of 0.5% w/v as a binder in a ratio of 2:1 by weight, the thus prepared product was coated as a protective layer on the top of the substrate comprising the silver nanowires using a bar coater, and then evaporated and dried to form a performance reinforcement layer as a protective layer on the top of the substrate.

Preparation 3: Preparation of Transparent Conductive Film Having Structures of FIG. 2 to FIG. 4

Transparent conductive films having the structures of FIG. 2 to FIG. 4 were prepared using the compositions of the above preparation examples 1 and 2 and using $MgF_2$ for forming an anti-reflection film.

Reference Preparation 1: Preparation of Transparent Conductive Film

With the exception that an ink comprising silver nanowires was used instead of the silver nanowire dispersion solution, a substrate was prepared in the same manner as the above preparation example 1 and then, a solution obtained by dissolving a silicon oxide based compound in ultrapure water at a concentration of 0.15% w/v was coated as a protective layer on the top of the silver nanowire substrate using a bar coater.

Comparative Examples 1-2

The surface of the transparent conductive film of the above preparation example 2 was treated with a surface treatment agent 1 containing hydrogen peroxide ($H_2O_2$) of 1% by weight and the surface of the transparent conductive film of the above reference example was treated with a surface treatment agent 2 containing of NaOCl of 1% by weight and $KClO_4$ of 1% by weight, and then the visibility thereof was evaluated.

Visibility was evaluated by two experimenters who evaluate each specimen by cross examination with scores of 1 to 5 where score 1 is given when patterns are not completely recognized and score 5 is given when patterns are completely recognized with naked eyes, and the results are shown in Table 1 below.

Figure 6:
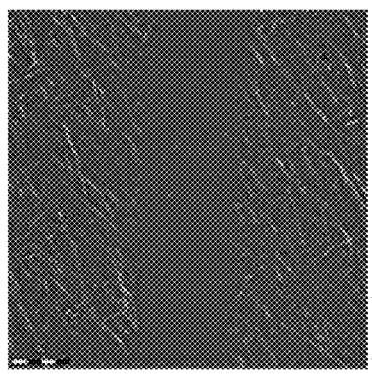
FIG. 6 is a surface photograph of the transparent conductive film having the structure of FIG. 1 after surface treatment with hydrogen peroxide.

A surface photograph obtained after the surface treatment of a transparent conductive film having the structure of FIG. 1 was shown in FIG. 6.

TABLE 1

| Surface Treatment Agent | Component 1 | % by weight | Component 2 | % by weight | Component 3 | % by weight | Break Time (in seconds) | Film Structure | Visibility |
|---|---|---|---|---|---|---|---|---|---|
| 1 | $H_2O_2$ | 1 | — | — | Pure Water | Remaining | 30-40 | Preparation Ex. 2 | 5 |
| 2 | NaOCl | 1 | $KClO_4$ | 1 | Pure Water | Remaining | 20-30 | Reference Prep. Ex. 1 | 5 |

As shown in FIG. 6, the transparent conductive film was confirmed to be an open circuit with the nanowires being completely removed, and as shown in Table 1 above, when the silver nanowires were removed in such a form, the visibility score was 5. It is determined that the visibility was not good because the top performance reinforcement layer or protective layer did not sufficiently prevent peroxides and the silver nanowires were thus removed.

Examples 1-8

Compositions comprising perchlorate diluted in distilled water, and acetic acid for stabilizing perchlorate in an amount of 2.5% by weight were prepared in accordance with the compositions set forth in Table 2 below and then the transparent conductive films of the above preparation examples 2 to 5 having structures of FIGS. 1 to 4, respectively were treated with them to evaluate the visibility thereof, and the results are shown in Table 2 below.

TABLE 2

| Surface Treatment Agent | Component 1 | % by weight | Component 2 | % by weight | Component 3 | % by weight | Component 4 | % by weight | Break Time (in seconds) | Film Structure | Visibility |
|---|---|---|---|---|---|---|---|---|---|---|---|
| 1 | NaOCl | 1 | $KClO_4$ | 1 | Acetic Acid | 2.5 | Pure Water | Remaining | 20-30 | FIG. 1 | 2 |
| 2 | $POCl_3$ | 0.25 | $CuSO_4$ | 1 | Acetic Acid | 2.5 | Pure Water | Remaining | 20-30 | FIG. 1 | 2 |

TABLE 2-continued

| Surface Treatment Agent | Component 1 | % by weight | Component 2 | % by weight | Component 3 | % by weight | Component 4 | % by weight | Break Time (in seconds) | Film Structure | Visibility |
|---|---|---|---|---|---|---|---|---|---|---|---|
| 3 | POCl$_3$ | 0.25 | Cu(NO$_3$)$_2$ | 1 | Acetic Acid | 2.5 | Pure Water | Remaining | 10-20 | FIG. 1 | 2 |
| 4 | KClO$_4$ | 1 | HCl | 1.5 | Acetic Acid | 2.5 | Pure Water | Remaining | 20-30 | FIG. 1 | 1 |
| 5 | NaOCl | 1 | KClO$_4$ | 1 | Acetic Acid | 2.5 | Pure Water | Remaining | 20-30 | FIG. 2 | 2 |
| 6 | NaOCl | 1 | KClO$_4$ | 1 | Acetic Acid | 2.5 | Pure Water | Remaining | 20-30 | FIG. 3 | 2 |
| 7 | NaOCl | 1 | KClO$_4$ | 1 | Acetic Acid | 2.5 | Pure Water | Remaining | 20-30 | FIG. 4 | 2 |
| 8 | POCl$_3$ | 0.25 | HCl | 0.5 | Acetic Acid | 2.5 | Pure Water | Remaining | 50-60 | FIG. 1 | 1 |

Figure 7:
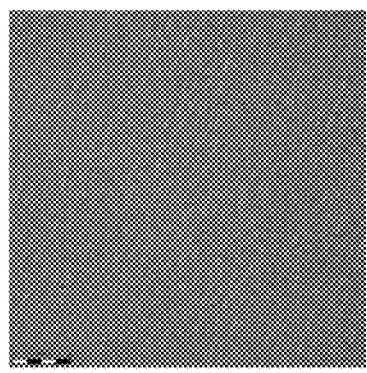
FIG. 7 and FIG. 8 are microscope photographs of the transparent conductive films after surface treatment using perchlorate and acetic acid where their visibility has scores 1 and 2, respectively.
Figure 8:
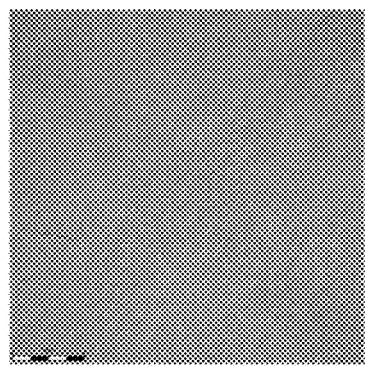

As shown in Table 2 above, when the surface treatment compositions comprising a) a peroxide and b) an organic acid or an inorganic acid were used, a patterning process could proceed without removing the silver nanowires and excellent visibility of 1 or 2 (see FIGS. 7 and 8) was obtained. In particular, the structure of FIG. 3 could proceed with pattern having very excellent visibility (visibility 1, FIG. 7).

The patterning method through the surface treatment of metal nanowires in accordance with the present invention is advantageous in pattern visibility in comparison with the conventional etching process where insulation properties are given by disassembling or separating the metal nanowires, and furthermore it can obtain excellent durability and environment resistance properties capable of protecting the conductive layer from the outside moisture and temperature changes as well as high visibility by introducing a metal oxide sol into an optical functional layer.

What is claimed is:

1. A method for patterning a metal nanowire-based transparent conductive film through surface treatment wherein a patterning process of the metal nanowire-based transparent conductive film comprises
   1) adding a performance reinforcement layer on a conductive layer comprising metal nanowires; and
   2) treating a surface of the metal nanowire-based transparent conductive film with a surface treatment composition comprising a) a peroxide, a perchlorate-based compound or a salt thereof, or POCl$_3$ and b) an organic acid or an inorganic acid without an etching process that eliminates the metal nanowires.

2. The method for patterning the metal nanowire-based transparent conductive film through surface treatment of claim 1, wherein the peroxide and the perchlorate-based compound or the salt thereof is one or more selected from the group consisting of sodium peroxide, carbamide peroxide, NaOCl, NaClO$_4$, NaClO$_2$, NaClO$_3$, NH$_4$ClO, NH$_4$ClO$_2$, NH$_4$ClO$_3$, NH$_4$ClO$_4$, KClO$_3$, KClO, KClO$_4$, and KClO$_2$.

3. The method for patterning the metal nanowire-based transparent conductive film through surface treatment of claim 1, wherein the peroxide, the perchlorate-based compound or the salt thereof, or POCl$_3$ is included in the surface treatment composition in an amount of 0.1 to 10% by weight.

4. The method for patterning the metal nanowire-based transparent conductive film through surface treatment of claim 1, wherein the organic acid is one or more selected from the group consisting of acetic acid, lactic acid, maleic acid, succinic acid, oxalic acid, and malonic acid.

5. The method for patterning the metal nanowire-based transparent conductive film through surface treatment of claim 1, wherein the inorganic acid is one or more selected from the group consisting of phosphoric acid, hydrochloric acid, and nitric acid.

6. The method for patterning the metal nanowire-based transparent conductive film through surface treatment of claim 1, wherein the surface treatment composition further comprises an inorganic compound.

7. The method for patterning the metal nanowire-based transparent conductive film through surface treatment of claim 1, wherein the organic acid or the inorganic acid is included in the surface treatment composition in an amount of 0.1 to 10% by weight.

8. The method for patterning the metal nanowire-based transparent conductive film through surface treatment of claim 1, wherein the performance reinforcement layer is formed with a composition containing a metal oxide sol.

9. The method for patterning the metal nanowire-based transparent conductive film through surface treatment of claim 8, wherein the metal oxide sol is one or more metal oxide sols selected from the group consisting of magnesium fluoride sol, calcium fluoride sol, ZTO (Zinc-Tin oxide) sol, ZnO (Zinc Oxide) sol, silicon oxide sol, tin oxide sol (Tin oxide), manganese oxide sol, and magnesium oxide sol.

10. The method for patterning the metal nanowire-based transparent conductive film through surface treatment of claim 8, wherein the composition further comprises a binder.

11. The method for patterning the metal nanowire-based transparent conductive film through surface treatment of claim 10, wherein the binder is one or more selected from the group consisting of a cellulose resin, polyvinyl alcohol resin, polyvinyl butyral resin, polyurethane acrylate resin, cellulose ether resin, and cellulose acetate resin.

12. The method for patterning the metal nanowire-based transparent conductive film through surface treatment of claim 1, wherein the metal nanowire has a diameter of 15 nm to 120 nm and a length of 5 μm to 60 μm.

13. A transparent conductive film prepared according to the patterning method of claim 1.

14. The transparent conductive film of claim 13, wherein the transparent conductive film has a transmittance of at least 80% and a sheet resistance of 300 Ω/□ or less.

15. An electronic device comprising the transparent conductive film as described in claim 13.

* * * * *